US005780863A

United States Patent [19]

Benveniste et al.

[11] Patent Number: 5,780,863
[45] Date of Patent: Jul. 14, 1998

[54] ACCELERATOR-DECELERATOR ELECTROSTATIC LENS FOR VARIABLY FOCUSING AND MASS RESOLVING AN ION BEAM IN AN ION IMPLANTER

[75] Inventors: Victor M. Benveniste, Gloucester; Peter L. Kellerman, Essex, both of Mass.

[73] Assignee: Eaton Corporation, Cleveland, Ohio

[21] Appl. No.: 841,725

[22] Filed: Apr. 29, 1997

[51] Int. Cl.[6] .......................... H01J 37/10; H01J 37/317
[52] U.S. Cl. ............................ 250/492.21; 250/398
[58] Field of Search .............................. 250/492.21, 398

[56] References Cited

U.S. PATENT DOCUMENTS

| | | | |
|---|---|---|---|
| 5,025,167 | 6/1991 | Okuda et al. | 250/492.21 |
| 5,091,655 | 2/1992 | Dykstra et al. | 250/492.2 |
| 5,160,846 | 11/1992 | Ray | 250/492.2 |
| 5,177,366 | 1/1993 | King et al. | 250/492.2 |
| 5,216,253 | 6/1993 | Koike | 250/492.21 |
| 5,373,164 | 12/1994 | Benveniste | 250/492.21 |
| 5,554,857 | 9/1996 | Benveniste | 250/492.21 |

*Primary Examiner*—Jack I. Berman
*Attorney, Agent, or Firm*—John A. Kastelic

[57] ABSTRACT

An electrostatic triode lens (36) is provided for use in an ion implantation system (10). The lens includes a terminal electrode (37) and an adjustable lens subassembly (40) comprising a suppression electrode (38) and a resolving electrode (39), each having matched curved surfaces (108, 110). The lens subassembly is positioned near the terminal electrode where the beam has a minimal waist in a first (dispersive) plane. Such positioning minimizes the required gaps between electrodes, and thus, helps minimize beam blow-up and the electron depletion region in the deceleration mode of operation. The suppression and resolving electrodes each have first and second portions (38A and 38B, 39A and 39B) separated by a gap (d38, d39). A movement mechanism (60, 62) simultaneously moves the first portions of the suppression and resolving electrodes (38A, 39A) toward and away from the second portions of the suppression and resolving electrodes (38B, 39B), respectively, to adjust the gaps (d38, d39) therebetween. The adjustable lens subassembly (40) conditions the beam output by the terminal electrode (37) by (i) variably focusing the beam in mutually orthogonal (dispersive and non-dispersive) planes in a deceleration mode of operation (where mass resolution is less critical), while (ii) permitting variable mass resolution in the dispersive plane in an acceleration mode of operation (where focusing is less critical). Generally, the gap (d39) between the resolving electrode pair (39) is adjusted to permit adjustable mass resolution in the dispersive plane in the acceleration mode of operation. In the deceleration mode of operation, adjustment of the gap (d39) provides adjustable dispersive plane focusing, while the voltage on suppression electrode (38) is adjusted to permit adjustable non-dispersive plane beam focusing.

30 Claims, 10 Drawing Sheets

ACCELERATOR-DECELERATOR ELECTROSTATIC LENS FOR VARIABLY FOCUSING AND MASS RESOLVING AN ION BEAM IN AN ION IMPLANTER

FIELD OF THE INVENTION

The present invention relates generally to the field of ion implanters, and more specifically to an electrostatic lens for variably focusing and mass resolving an ion beam in an ion implanter in both acceleration and deceleration modes of operation.

BACKGROUND OF THE INVENTION

Ion implantation has become the technology preferred by industry to dope semiconductors with impurities in the large scale manufacture of integrated circuits. Ion dose and ion energy are the two most important variables used to define an implant step. Ion dose relates to the concentration of implanted ions for a given semiconductor material. Typically, high current implanters (generally greater than 10 milliamps (mA) ion beam current) are used for high dose implants, while medium current implanters (generally capable of up to about 1 mA beam current) are used for lower dose applications.

Ion energy is used to control junction depth in semiconductor devices. The energy levels of the ions which make up the ion beam determine the degree of depth of the implanted ions. High energy processes such as those used to form retrograde wells in semiconductor devices require implants of up to a few million electron volts (MeV), while shallow junctions may only demand energies below 1 thousand electron volts (1 KeV).

A typical ion implanter comprises three sections or subsystems: (i) a terminal for outputting an ion beam, (ii) a beamline for mass resolving and adjusting the focus and energy level of the ion beam, and (iii) a target chamber which contains the semiconductor wafer to be implanted by the ion beam. The beamline typically includes a mass resolving aperture of fixed dimension and an acceleration/deceleration lens for focusing the ion beam. The continuing trend to smaller and smaller semiconductor devices requires a beamline construction which serves to deliver high beam currents at low energies. The high beam current provides the necessary dosage levels, while the low energy levels permit shallow implants. Source/drain junctions in semiconductor devices, for example, require such a high current, low energy application.

Low energy ion beams which propagate through a given beamline construction suffer from a condition known as beam "blow-up", which refers to the tendency for like-charged ions within the ion beam to mutually repel each other (also known as the space charge effect). Such mutual repulsion causes a beam of otherwise desired shape to diverge away from an intended beamline path. Beam blow-up is particularly problematic in high current, low energy applications because the high concentration of ions in the beam (high current) exaggerates the force of mutual repulsion of the ions, and the propagation potentials (low energy) of the ions are insufficient to counteract these mutually repulsive forces. The problem of beam blow-up increases with increasing beamline lengths. Therefore, a design objective of preferred beamline constructions is to minimize the length of the beamline.

Electrostatic lenses are known for both accelerating and decelerating the ions in an ion beam to achieve suitable energy levels, as well as for focusing the ion beam to counteract the mutually repulsive charges responsible for the beam blow-up phenomenon. Typically, such a lens comprises a plurality of electrodes of increasingly greater or lesser electrical potential. The individual ions within the beam are accelerated or decelerated at rates depending on this potential gradient, and focusing is achieved by resultant electric fields emanating from the electrodes.

One example of an accelerating/decelerating focusing electrostatic lens is shown in U.S. Pat. No. 5,177,366 to King et al., commonly assigned to the assignee of the present invention and incorporated by reference as if fully set forth herein. In the King patent, a mass resolving aperture and an electrostatic lens are separated by a pair of deflection electrodes. The mass resolving aperture rejects ions having an inappropriate charge-to-mass ratio from the beam. The electrostatic lens is used in conjunction with an immediately downstream accelerator for (i) focusing in orthogonal planes an ion beam which has been initially deflected by a pair of deflection electrodes, and (ii) accelerating the ions in the beam to achieve a desired implantation energy level. The focusing accomplished by the lens is adjusted by varying any of the following: the gap between electrodes, the thickness of the electrodes, the curvature of the electrodes, the electrical potential of the electrodes, or the dimensions of a slot in a first electrode through which the ion beam passes.

Varying the dimension of the slot in an electrode, however, requires removal and replacement of plates which in part define the slot configuration. Removal and replacement of beamline components to accommodate different types of implant operations (i.e. various current or energy levels) is undesirable, however, in that the evacuated chamber in which the components are located must be opened. Opening the evacuated chamber requires pressurization to atmospheric pressure and subsequent re-evacuation, as well as subjecting the interior of the chamber to contamination.

Accordingly, it is an object of the present invention to provide an electrostatic lens assembly for adjustably mass resolving in a first plane, and adjustably focusing an ion beam in the first plane and a second mutually perpendicular or orthogonal plane, depending upon ion beam current or energy levels, and which has particular applications in high current, low energy ion implanters.

A further object of the invention is to provide an adjustable electrostatic lens subassembly, having electrodes the gaps between which are infinitely adjustable within a range, to facilitate ion beam focusing without requiring removal and replacement of lens components.

A further object of the invention is to minimize beamline length in an ion implanter to prevent beam blow-up conditions.

Still a further object of the invention is to provide an adjustable lens subassembly which combines a variably adjustable electrostatic lens with a variably adjustable resolving aperture, which subassembly provides for variable focusing in deceleration modes of operation yet still permits variable mass resolution in acceleration modes of operation.

SUMMARY OF THE INVENTION

An electrostatic triode lens is provided for use in an ion implantation system. The lens includes a terminal electrode and an adjustable lens subassembly comprising a suppression electrode and a resolving electrode. The lens subassembly is positioned near the terminal electrode where the beam has a minimum "waist" in a first (dispersive) plane. Such positioning minimizes the required gaps between electrodes, and thus, helps minimize beam blow-up and the electron depletion region in the deceleration mode of operation.

3

The suppression and resolving electrodes each have first and second portions separated by respective gaps. A movement mechanism simultaneously moves the first portions of the suppression and resolving electrodes toward and away from the second portions of the suppression and resolving electrodes, respectively, to adjust the gaps therebetween. The adjustable lens subassembly conditions the beam output by the terminal electrode by (i) variably focusing the beam in mutually orthogonal (dispersive and non-dispersive) planes in a deceleration mode of operation (where mass resolution is less critical), while (ii) permitting variable mass resolution in the dispersive plane in an acceleration mode of operation (where focusing is less critical).

Generally, the gap between the resolving electrode pair is adjusted to permit adjustable mass resolution in the dispersive plane in the acceleration mode of operation. In the acceleration mode of operation, the focusing effect of the lens subassembly is negligible due to the "stiffness" of the beam and the reduced tendency of beam blow-up. Variable mass resolution, however, is achieved in the acceleration mode by adjusting the gap between the resolving electrode pair. By providing the capability of simultaneous adjustment of the suppression electrode gap along with the resolving electrode gap, a negative suppression voltage is maintained on the gap axis with a reasonably small suppression electrode voltage despite the existence of a large positive voltage at the terminal electrode, while still permitting variable mass resolution.

In the deceleration mode of operation, the lens subassembly functions to focus the ion beam in mutually orthogonal (dispersive and non-dispersive) planes. Adjustment of the resolving electrode gap provides adjustable dispersive plane focusing. Increased focusing in the dispersive plane is achieved by decreasing the gap of the resolving electrode. Adjustment of the voltage on the suppression electrode permits adjustable non-dispersive plane beam focusing. Generally, more non-dispersive plane focusing is achieved by increasing the magnitude of the negative voltage applied to the suppression electrode.

4

DETAILED DESCRIPTION OF A PREFERRED EMBODIMENT

Figure 1:
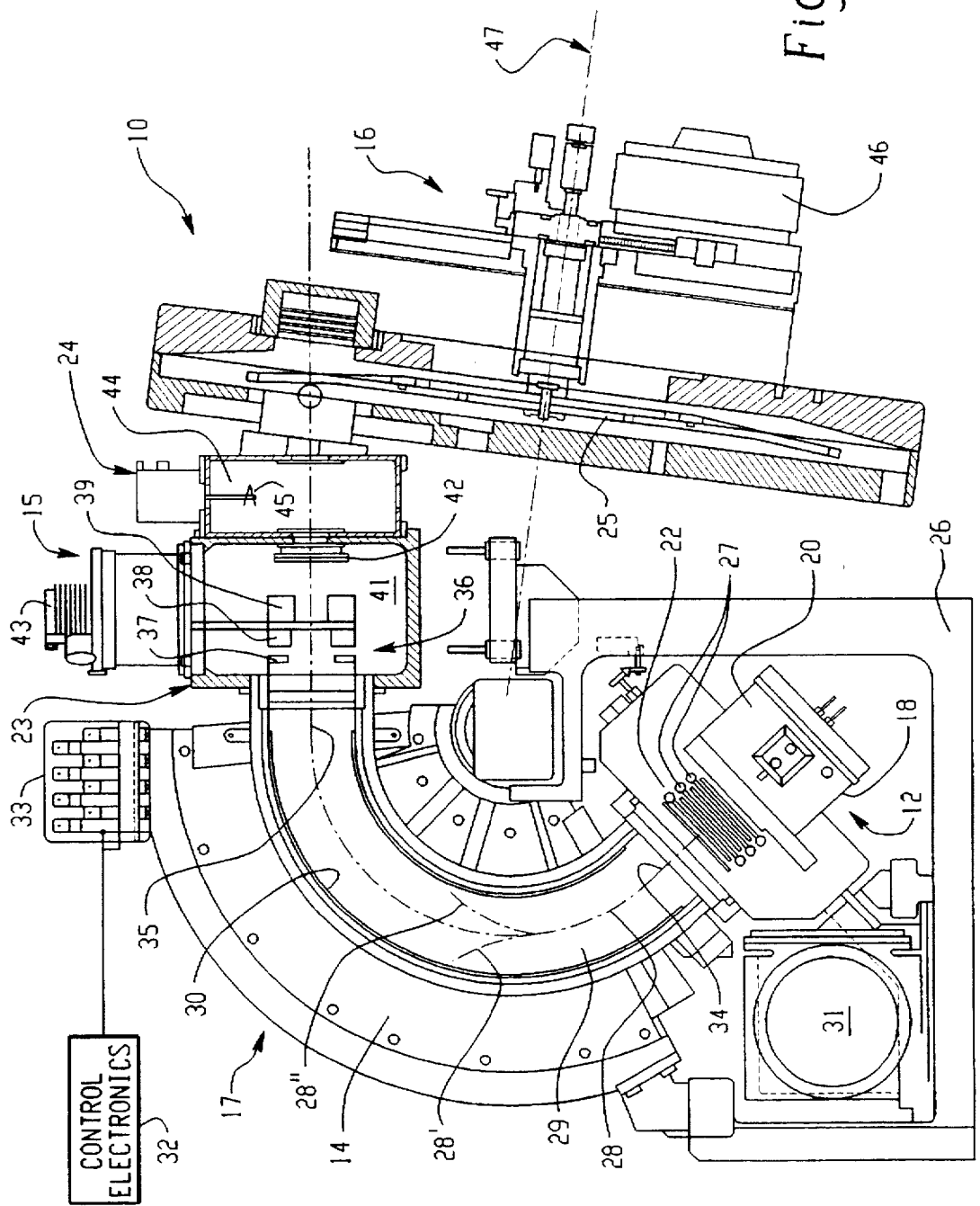
FIG. 1 is a plan view of an ion implantation system incorporating one embodiment of an electrostatic triode lens constructed according to the principles of present invention.

Referring now to the drawings, FIG. 1 discloses an ion implanter, generally designated 10, which comprises an ion source 12, a mass analysis magnet 14, a beamline assembly 15, and a target or end station 16. The ion source 12 and the mass analysis magnet 14, along with their respective power supplies, are collectively referred to as a terminal 17 (also see FIG. 2). One application of the present invention is in a low energy implanter, such as that shown in FIG. 1, wherein the beamline assembly 15 is relatively short due to the tendency of a low energy beam to diffuse (i.e., "blow-up") during propagation thereof.

The ion source 12 comprises a housing 18 which defines a plasma chamber 20, and an ion extractor assembly 22. The beamline assembly 15 includes a resolver housing 23 and a beam neutralizer 24. As explained further below, the resolver housing 23 contains the subject invention. The beam neutralizer 24 functions to minimize beam blow-up. Downstream of the beam neutralizer 24 is the end station 16, which includes a disk- shaped wafer support 25 upon which wafers to be treated are mounted. The wafer support 25 resides in a target plane which is (generally) perpendicularly orientated to the direction of the implant beam.

The ion source 12 is mounted to an L-shaped frame 26. Ionizable dopant gas, which is obtained either directly in the form of a compressed gas or indirectly from a solid form which has been vaporized, is injected into the plasma chamber 20. Typical source elements are boron (B), phosphorous (P), gallium (Ga), indium (In), antimony (Sb), and arsenic (As). Most of these source elements are provided in solid form, except boron, which is typically provided in the form of gaseous boron trifluoride or diborane.

Energy is imparted to the ionizable dopant gas to generate ions within the plasma chamber 20. Generally, positive ions are generated, although the present invention is applicable to systems wherein negative ions are generated by the source. The positive ions are extracted through a slit in the plasma chamber 20 by the ion extractor assembly 22 which comprises a plurality of electrodes 27. The electrodes are charged with negative potential voltages, increasing in magnitude as the distance from the plasma chamber slit increases. Accordingly, the ion extractor assembly functions to extract a beam 28 of positive ions from the plasma chamber and accelerate the extracted ions into the mass analysis magnet 14 which is supported by frame 26.

The mass analysis magnet 14 functions to pass only ions of an appropriate charge-to-mass ratio to the resolver housing 23. The mass analysis magnet 14 is required because the ion source 12, in addition to generating ions of appropriate charge-to-mass ratio, also generates ions of greater or lesser charge-to-mass ratio than that desired. Ions of inappropriate charge-to-mass ratios are not suitable for implantation into a wafer.

The mass analysis magnet 14 includes a curved beam path 29 which is defined by an aluminum beam guide 30, evacuation of which is provided by a vacuum pump 31. The ion beam 28 which propagates along this path is affected by the magnetic field generated by the mass analysis magnet 14. The strength and orientation of this magnetic field is controlled by control electronics 32 which adjust the electrical current through the field windings of the magnet 14 through magnet connector 33. Partial focusing of the ion beam by the magnet 14 is achieved in the "dispersive" plane (the plane of the curved beam path 29) only by establishing a gradient in the magnetic field (i.e., "indexing"), or by rotating the entrance or exit poles of the magnet 14.

The magnetic field causes the ion beam 28 to move along the curved beam path 29, from a first or entrance trajectory 34 near the ion source 12 to a second or exit trajectory 35 near the resolving housing 23. Portions 28' and 28" of the beam 28 comprised of ions having an inappropriate charge-to-mass ratio are deflected away from the curved trajectory and into the walls of aluminum beam guide 30. In this manner, the magnet 14 passes to the resolving housing 23 only those ions in the beam 28 which have the desired charge-to-mass ratio.

The entrance and exit trajectories 34, 35 of the ion beam 28, being in the plane of the curved beam path 29, lie in the dispersive plane. The "non-dispersive" plane is defined herein as the plane which resides perpendicular to both the dispersive plane and the target plane. Accordingly, the magnet 14 performs mass analysis in the dispersive plane by removing from the beam ions of inappropriate charge-to-mass ratio, and redirecting the beam from the entrance trajectory 34 to the exit trajectory 35 and toward the target plane in which the wafer lies.

The resolving housing 23 contains an electrostatic lens 36, constructed according to the principles of the present invention, which mass resolves and focuses the ion beam 28 output by the magnet 14. The electrostatic lens 36 is constructed in a triple electrode (triode) configuration comprising a terminal electrode pair 37, a suppression electrode pair 38 and a ground or resolving electrode pair 39. The terminal electrode pair is fixedly attached to the terminal 17 and operates at the voltage thereof (positive in the acceleration mode and negative in the deceleration mode). Each of the pair of the suppression electrodes 38, like each of the pair of the ground electrodes 38, is movable toward and away from each other to adjust the gap therebetween, as further explained below with respect to FIG. 3. The suppression electrode 37 operates at a negative potential and the resolving electrode 39 is at ground potential (zero volts).

The suppression and resolving electrode pairs 38, 39 are collectively referred to as the adjustable lens subassembly 40. The resolving housing 23 defines a chamber 41 in which resides the electrostatic lens 36, as well as a dosimetry indicator such as a Faraday flag 42 (which forms no part of the present invention). The chamber 41 is evacuated by a vacuum pump 43. The adjacent beam neutralizer 24 defines a chamber 44 which includes an electron shower 45. The electron shower 45 neutralizes the positive charge which would otherwise accumulate on the target wafer as a result of being implanted by the positively charged ion beam 28.

The disc shaped wafer support 25 at the end station 16 is rotated by motor 46. The ion beam thus strikes wafers mounted to the support as they move in a circular path. The end station 16 is pivotable along an axis 47 which is generally parallel to the path of the ion beam so that the target plane is adjustable about this axis. In this manner, the angle of ion implantation may be slightly modified from the normal.

The adjustable lens subassembly 40 functions to focus the ion beam (especially in the deceleration mode) and mass resolve the ion beam (especially in the acceleration mode). The subassembly 40 is positioned immediately downstream of the terminal electrode 37 because the ion beam has a minimum dimension (i.e. a "waist") in the dispersive plane at this location. Such positioning minimizes the required gaps between electrodes, and thus, helps minimize beam blow-up and the electron depletion region in the deceleration mode of operation.

In the acceleration mode of operation, the lens 35 functions primarily as a mass resolver (focusing less critical) and in the deceleration mode of operation the lens 35 functions primarily as a focusing element (mass resolution less critical).

Accordingly, the same lens 35 may be used in both the acceleration mode (from 10–30 kilovolts (kV) up to 90 kV, at 25 mA) and the deceleration mode (from 2–5 kV down to 0.5 kV, at 2 mA) of operation of the ion implantation system 10.

Figure 2:
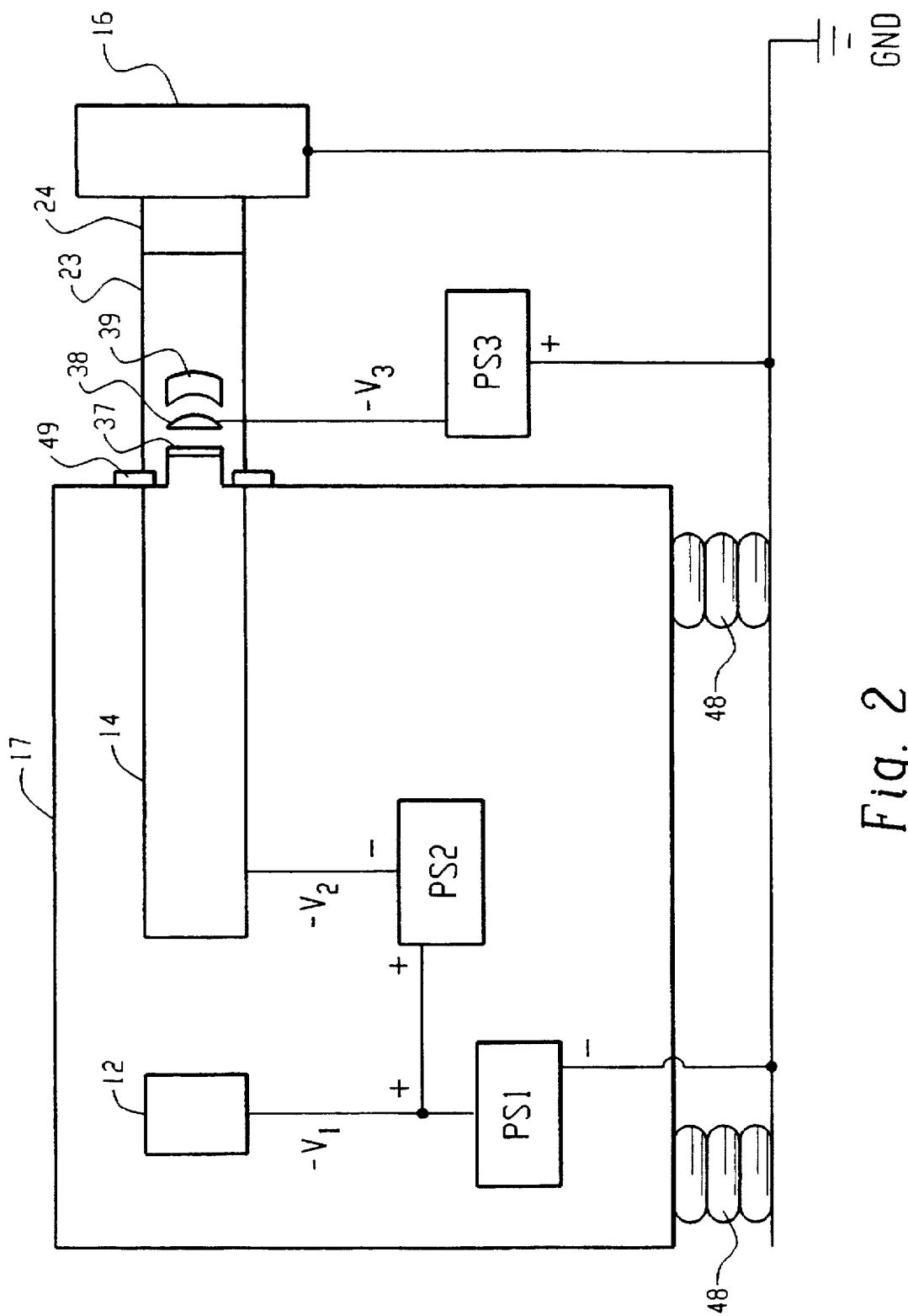
FIG. 2 is schematic diagram showing the power supplies used to supply voltage to various elements of the system of FIG. 1.

Both modes of operation are made possible by adjusting variable high voltage power supplies incorporated into the system 10, as shown in FIG. 2. A first power supply PS1 supplies power (+V1) to the source 12, a second power supply PS2 supplies power (–V2) to the terminal 17, and a third power supply PS3 supplies power (–V3) to the suppression electrode 38 of the electrostatic lens 36. By way of example only, PS1 operates from about 0.5 to 90 kV. PS2 operates from about –2 kV to –30 kV, and PS3 operates from about –5 kV to –25 kV.

Again, by way of example, in the acceleration mode of operation, PS1 operates at 90 kV which is applied directly to the source 12. PS2 operates at –30 kV, which coupled with PS1, applies 60 kV (90 kV–30 kV) to the magnet 14. Accordingly, the terminal operates at 60 kV which is the voltage of the terminal electrode 37. Electrical isolator bushings 48 isolate the terminal 17 from the system enclosure (earth ground), and electrical isolator bushing 49 isolates the terminal 17 from the resolving housing 23 (also at earth ground). The ion beam, which is initially accelerated by the drop in voltage potential of 30 kV from the source 12 to the magnet 14, is further accelerated on its way toward the target wafer in the end station, which is at a further negative potential (earth ground) with respect to the terminal.

In the deceleration mode of operation, PS1 operates at 0.5 kV which is applied directly to the source 12. PS2 operates at –5 kV, which coupled with PS1, applies –4.5 kV (0.5 kV–5 kV) to the magnet. Accordingly, the terminal operates at –4.5 kV which is the voltage of the terminal electrode 37. The ion beam, which is initially accelerated by the drop in voltage potential of 5 kV from the source 12 to the magnet 14, is then decelerated on its way toward the target wafer in the end station, which is at a positive potential (earth ground) with respect to the terminal.

Figure 3:
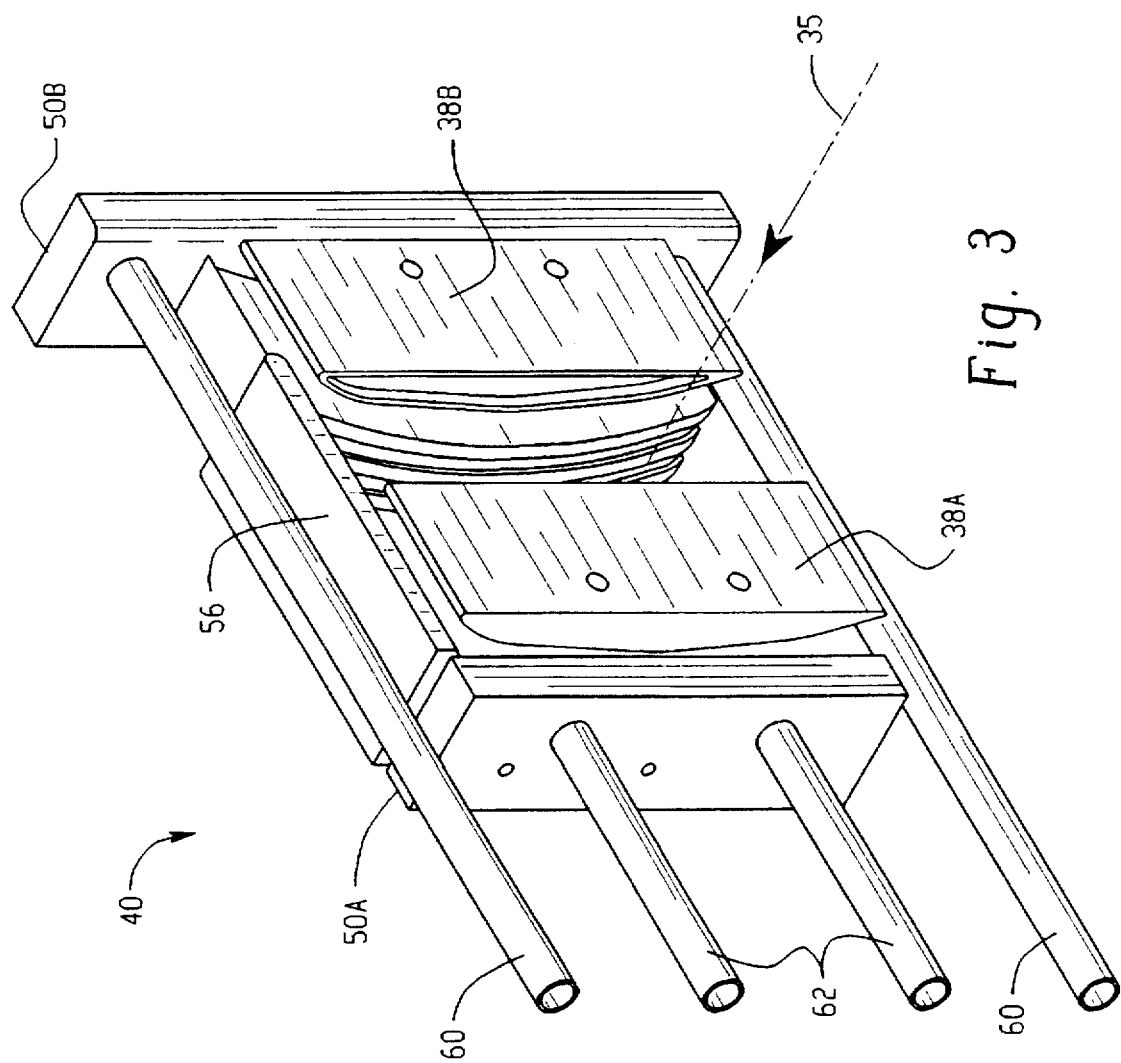
FIG. 3 is a perspective view of an adjustable lens subassembly portion of the triode lens of FIG. 1.
Figure 4:
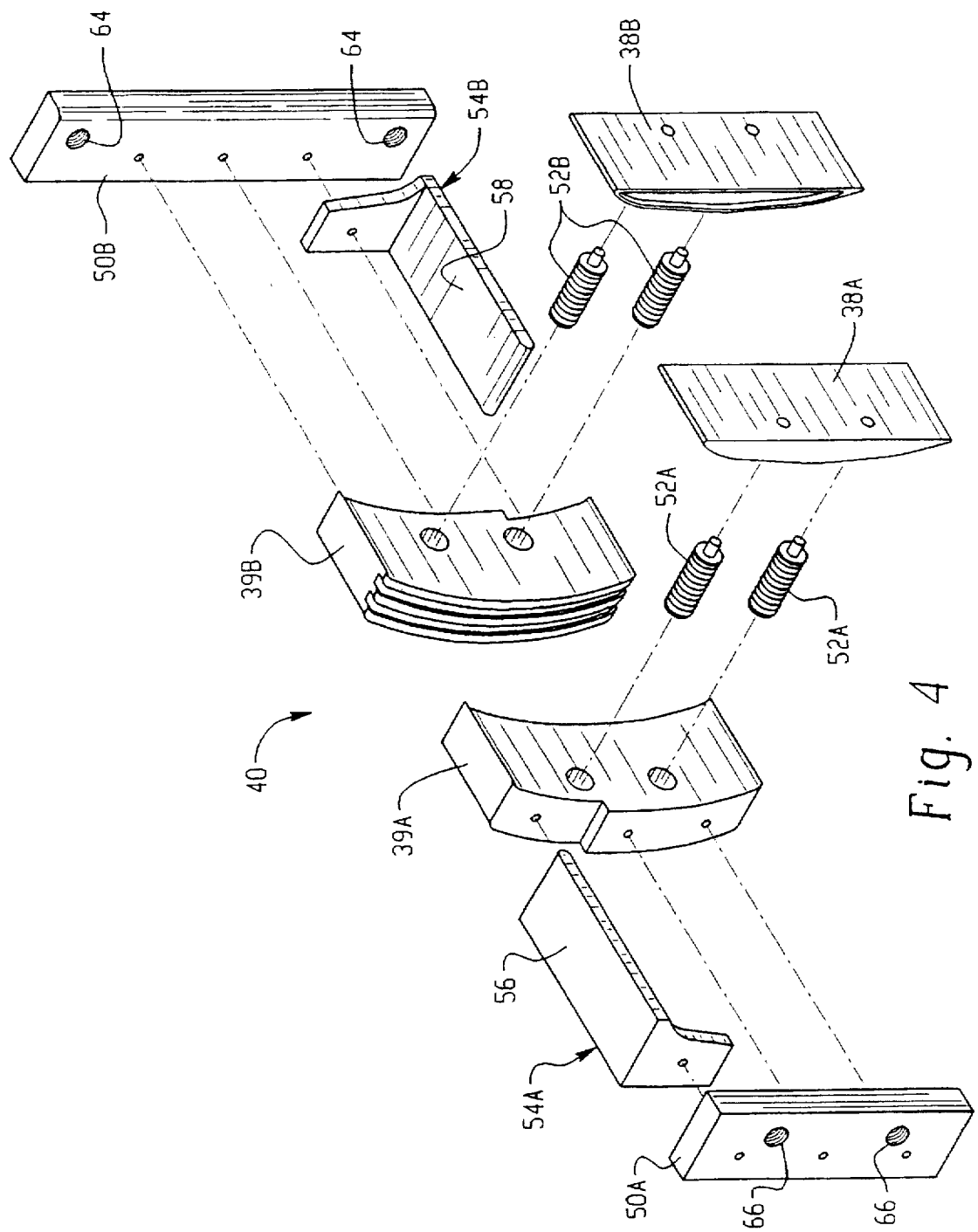
FIG. 4 is an exploded view of a portion of the adjustable lens subassembly of FIG. 3.

FIGS. 3–4 show in greater detail the adjustable lens subassembly 40, which includes suppression electrode pair 38A, 38B and resolving electrode pair 39A, 39B but not terminal electrode pair 37A, 37B (which are fixedly attached to terminal 17). As shown in FIG. 3, electrode pairs 38 and 39 are disposed such that an ion beam traversing the second trajectory 35 out of the mass analysis magnet 14 and the terminal electrode pair (37A and 37B) successively passes through and between gaps between the suppression electrode pair 38 (38A and 38B) and the resolving electrode pair 39 (39A and 39B).

As shown in FIG. 4, resolving electrodes 39A and 39B are directly mounted to water cooled steel blocks 50A and 50B, respectively, using suitable fasteners such as screws (not shown). Suppression electrodes 38A and 38B are directly mounted to resolving electrodes 39A and 39B, respectively, by insulators 52A and 52B. L-shaped brackets 54A and 54B, attached intermediate block 50A and resolving electrode 39A, and intermediate block 50B and resolving electrode 39B, respectively, provide end plates 56 and 58 which function to close the ends of the gap between electrodes 39A and 39B (also see FIGS. 7 and 10).

The means to adjust the gap d38 between the suppression electrode pair 38A and 38B, and the gap d39 between the resolving electrodes 39A and 39B (see FIG. 8) is provided by slidable shafts 60 and 62 which move independently of each other in directions along the axes thereof. The respective gaps between the suppression and resolving electrode pairs are thereby made selectively adjustable. The desired gap distance is selected depending upon the desired focusing and mass resolving effect of the lens, and the desired energy level of the ion beam.

The shafts 60 are coupled directly to the water cooled steel block 50B, and thus indirectly to resolving electrode 39B and suppression electrode 38B, at the locations of holes 64. The shafts 62 are coupled directly to the water cooled steel block 50A, and thus indirectly to resolving electrode 39A and suppression electrode 38A, at the locations of holes 66. The mechanism which permits slidable movement of shafts 60 and 62 in directions along the axes thereof is not shown, although any suitable mechanism, such as a servomotor, can be utilized. In the preferred embodiment, a pair of servomotors which are located outside of resolving housing 23 are connected, respectively, to shafts 60 and 62. Such a mechanism provides a means for simultaneous adjustment of the distances d38 and d39, infinitely adjustable within a given range.

Figure 5:
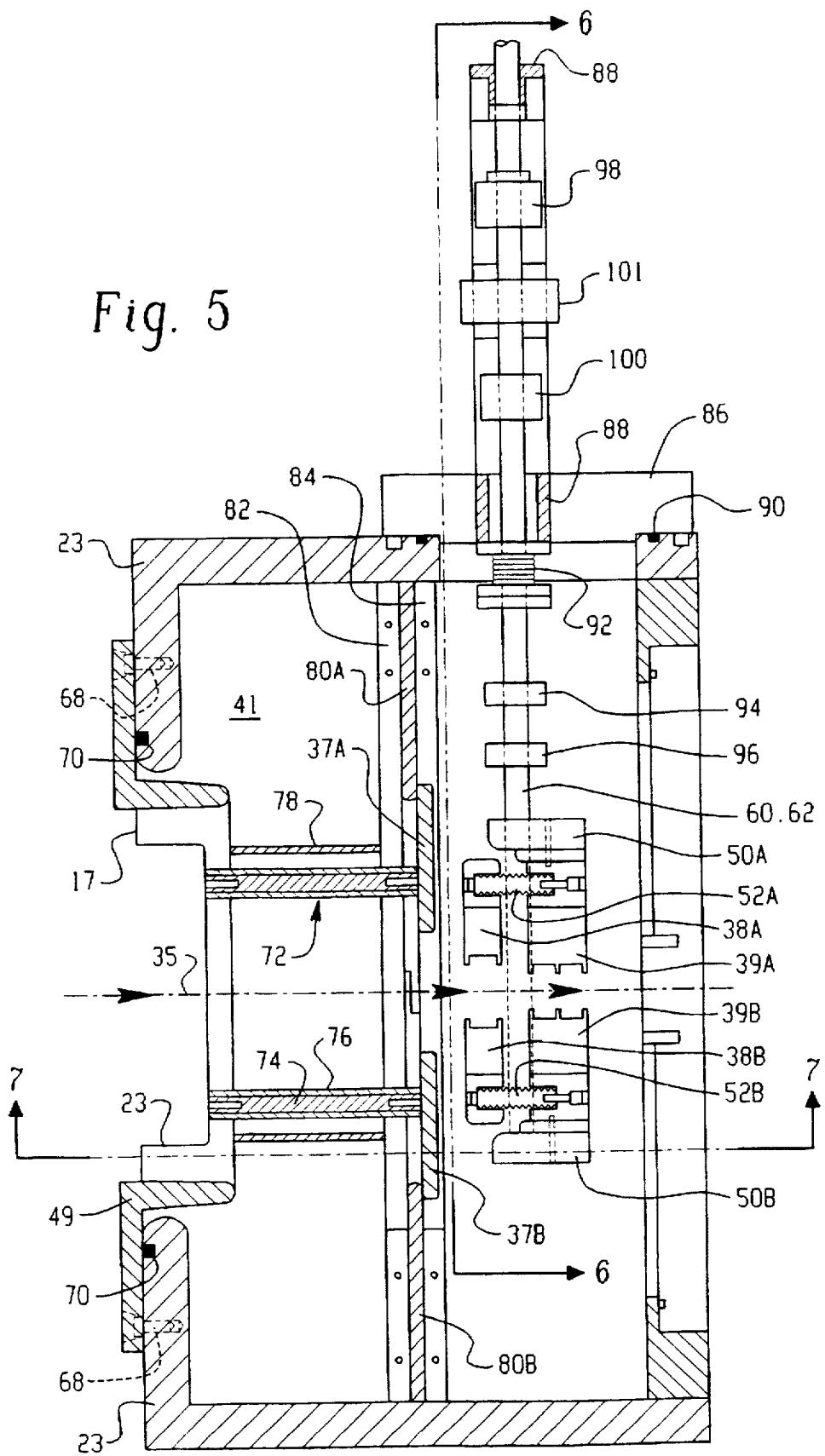
FIG. 5 is a more detailed plan view of the triode lens of the ion implantation system of FIG. 1.
Figure 6:
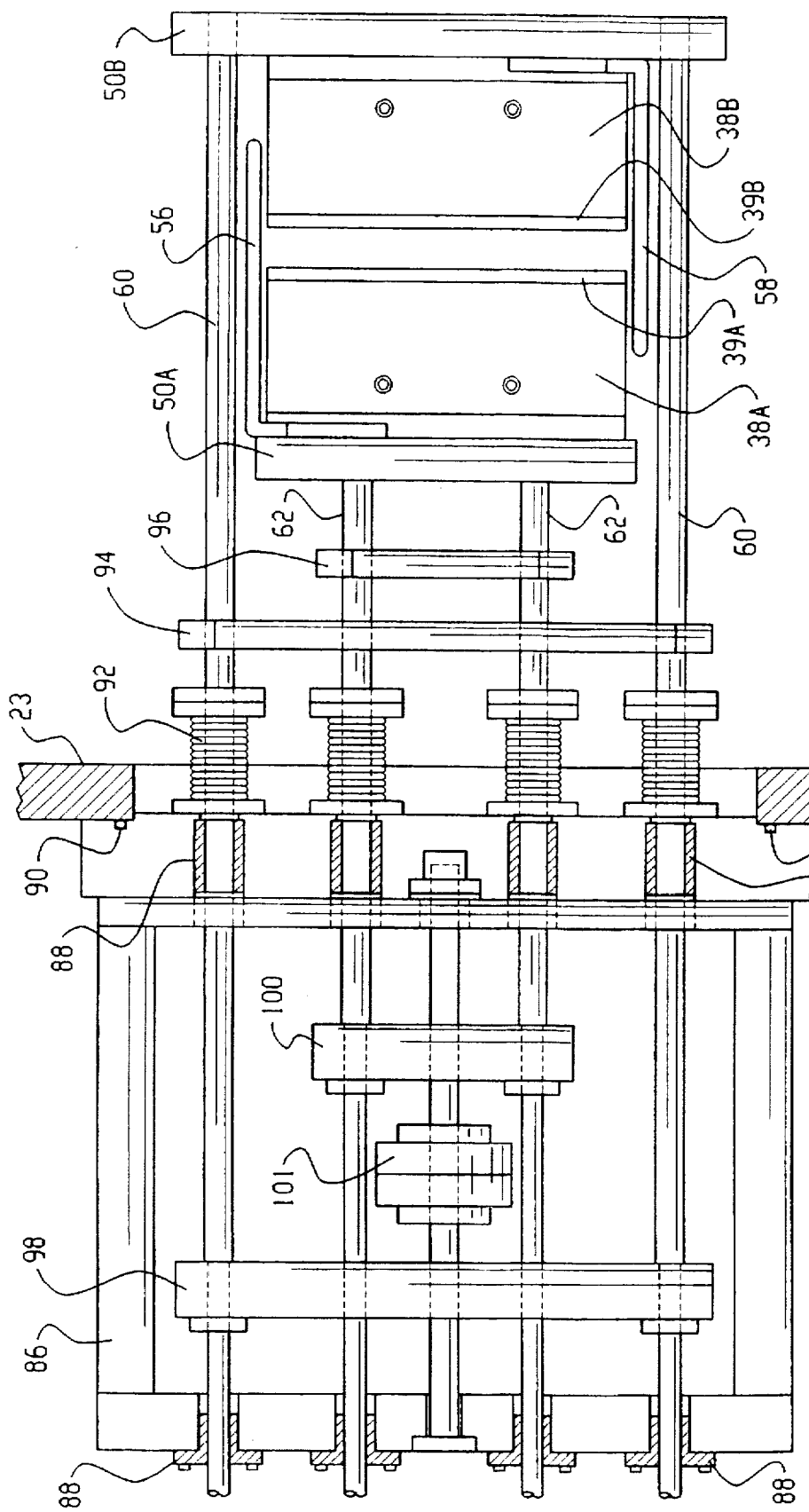
FIG. 6 is a sectional view of the adjustable lens subassembly portion of the triode lens of FIG. 5, taken along the lines 6—6 of FIG. 5.

FIGS. 5 and 6 provide a more detailed illustration of the manner in which the triode electrostatic lens 36 is coupled to the resolver housing 23 and positioned within the resolving chamber 41. As shown in FIG. 5, the resolver housing 23 is attached with bolts 68 to the bushing 49 which isolates the housing 23 from the terminal 17. A seal 70 is provided to maintain the integrity of the vacuum within the housing 23.

The terminal electrodes 37A and 37B, which are made of graphite, are attached to the terminal 17 by means of a plurality of standoffs 72 which comprise aluminum rods 74 coated with graphite 76. A shielding material 78 surrounds the plurality of standoffs 72 to electrically shield the standoffs from the resolver housing, especially in the deceleration mode of operation. Insulating baffles 80A and 80B, respectively, electrically isolate the terminal electrodes 37A and 37B from the resolver housing 23. Retaining members 82 and 84 are located on either side of and maintain the position of the insulating baffles 80A and 80B.

The adjustable lens subassembly 40 is attached to the resolver housing 23 by means of bracket 86 which is fixedly attached to the housing 23. The bracket 86 includes nylon bearings 88 which permit sliding movement of the slidable rods 60 and 62 along the axes thereof. A seal 90 is provided to maintain the integrity of the vacuum within the housing 23. Extensible vacuum seals 92 allow the vacuum to be maintained while permitting slidable movement of the rods 60 and 62 into and out of the resolving chamber 41. Support members 94 and 96, respectively, support the slidable rods 60 and 62 within the resolving chamber 41. Support members 98 and 100, respectively, support the slidable rods 60 and 62 outside the resolving chamber 41. Alignment coupling 101 allows for proper alignment of the shafts 60, 62.

Figure 7:
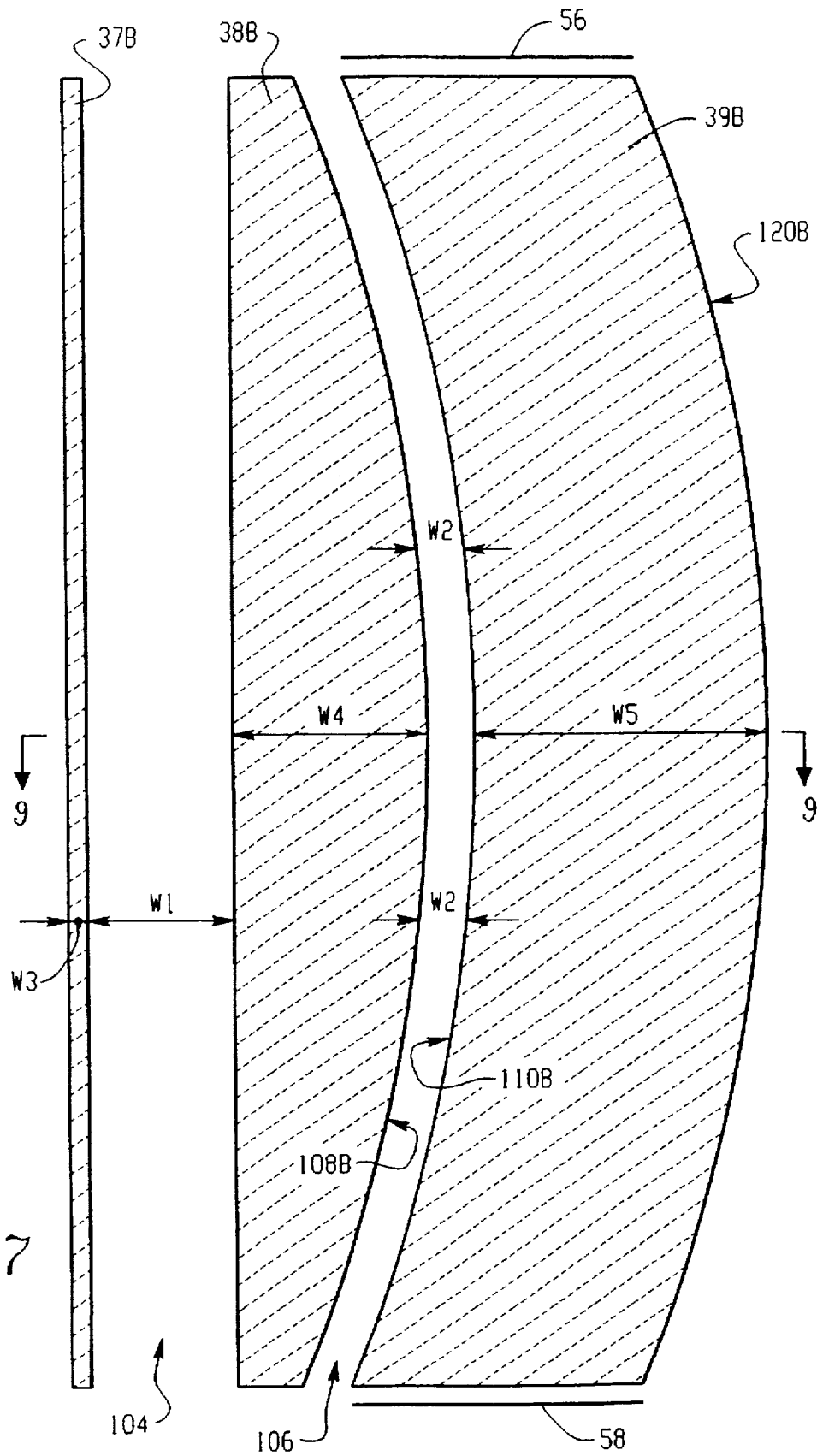
FIG. 7 is a sectional view of the electrode components of the triode lens of FIG. 5, taken along the lines 7—7 of FIG. 5.
Figure 8:
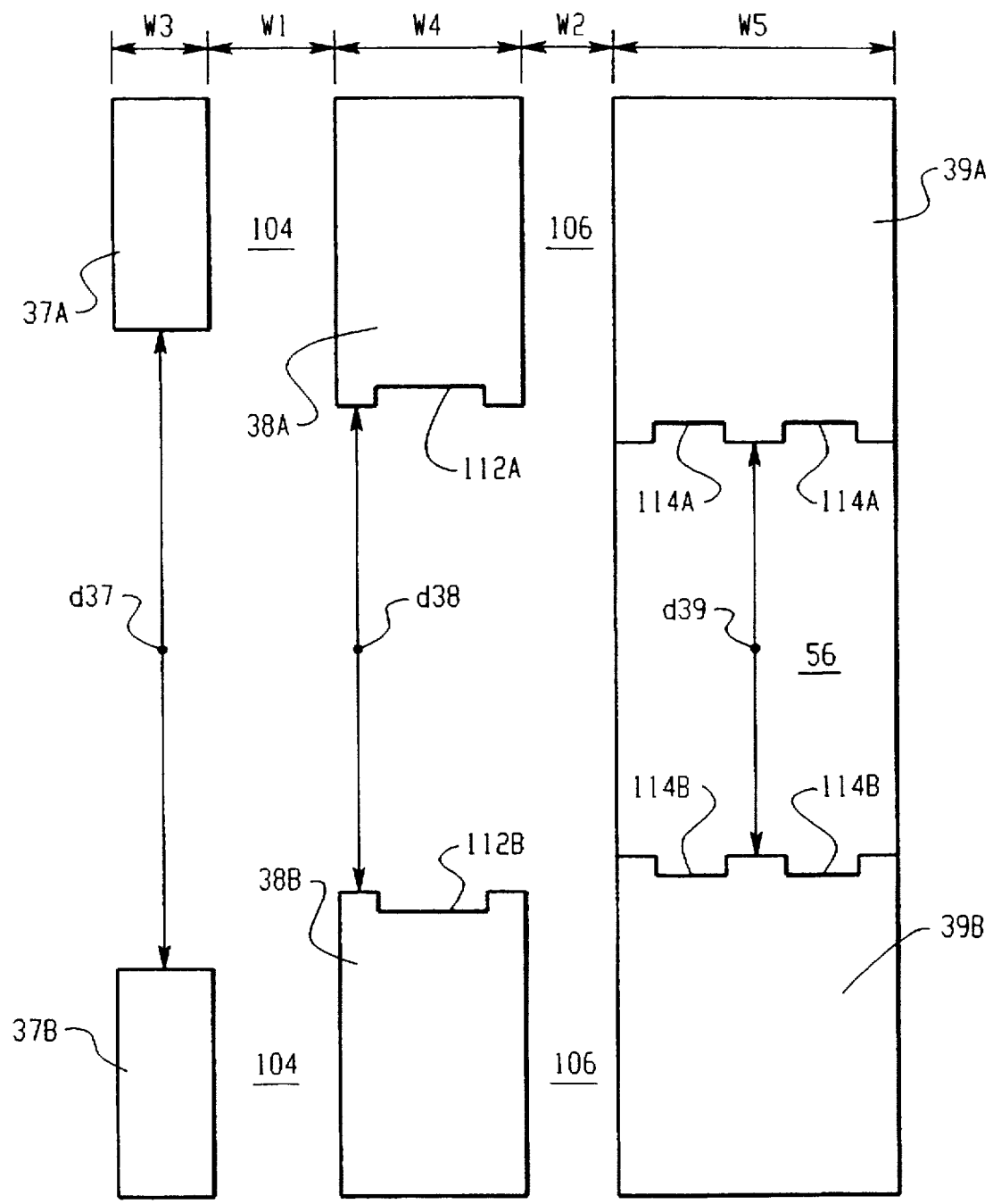
FIG. 8 is a plan view of the electrode components of the triode lens of FIG. 5.

FIGS. 7 shows the spaces between the electrode elements of the triode lens 36, and FIG. 8 shows the gaps between the same element electrode pairs in the triode lens, which includes the terminal electrode 37 and the adjustable lens subassembly 40 (including suppression electrode 38 and resolving electrode 39). FIG. 7 shows terminal electrode 37B, suppression electrode 38B, and resolving electrode 39B, all of which are made of graphite to reduce the effects of sputtering. Space 104 separates electrodes 37B and 38B, and space 106 separates electrodes 38B and 39B. The end plates 56 and 58 are shown on the top and bottom ends of electrode 39B. Spaces 104 and 106 and end plates 56 and 58 extend into the plane of FIG. 7 and thus are the same for corresponding electrodes 37A, 38A and 39A.

The widths W1 and W2 of spaces 104 and 106 respectively are, in the disclosed embodiment, 15 millimeters (mm) and 5 mm. Width W2 is defined by corresponding facing curved surfaces 108B and 110B on the suppression and resolving electrodes 38B and 39B, respectively. Suppression and resolving electrodes 38A and 39A are similarly provided with curved surfaces 108A and 110A, respectively. The widths of the electrodes 37B (W3), 38B (W4), and 39B (W5) are, respectively, 2 mm, 20 mm (at center), and 30 mm (at center). The widths of electrodes 37A, 38A, and 39A are identical.

FIG. 8 shows the gaps between the individual electrodes forming each electrode pair 37, 38 and 39. The distances between the individual electrode members in each pair are represented as d37, d38, and d39, respectively. In the preferred embodiment, the fixed distance d37 between terminal electrodes 37A and 37B is approximately 66 mm. The distance d38 between suppression electrodes 38A and 38B, and the distance d39 between resolving electrodes 39A and 39B, however, are dependently variable, as explained above.

In order to reduce the effect of deposition and sputtering of cross-contaminants on the electrodes 38 and 39, notches 112A and 112B are cut into suppression electrodes 38A and 38B, respectively, and notches 114A and 114B are cut into resolving electrodes 39A and 39B, respectively. The notches 112 and 114 minimize the surface area defining the gaps represented by distances d38 and d39, respectively, without adversely affecting the focusing capabilities of the triode lens 36.

The terminal electrode 37 of the triode lens 36 functions in connection with the mass analysis magnet 14 to eliminate undesirable ion species from the ion beam which have escaped the magnet but which have a charge-to-mass ratio which is close to, but not identical to the required ratio. Accordingly, the terminal electrode 37 further resolves the ion beam in the dispersive plane, and further defines the shape of the ion beam 28 at the potential of the terminal 17. The adjustable lens subassembly 40 conditions this defined beam from the terminal by (i) variably focusing the beam in both the dispersive and non-dispersive planes in a deceleration mode of operation, while (ii) permitting variable mass resolution in the dispersive plane in an acceleration mode of operation. Generally, the gap d39 between the resolving electrode pair 39 is adjusted to permit adjustable mass resolution in the dispersive plane in the acceleration mode of operation, wherein beam focusing is less critical. In the deceleration mode of operation, wherein mass resolution is less critical, adjustment of the gap d39 provides adjustable dispersive plane focusing, while the voltage on suppression electrode 38 is adjusted to permit adjustable non-dispersive plane beam focusing.

In the acceleration mode of operation, the curvature of the equi-potential lines near the entrance of the triode lens 36 initially causes the incoming ion beam to be focused in the dispersive plane. (The equi-potential lines are perpendicular to the electric field lines emanating from the electrodes, as the electric field is opposite the gradient of the electric potential.) However, a counteractive defocusing effect is caused by the opposite curvature of the equi-potential lines near the exit of the lens. This counteractive defocusing effect is less than the focusing effect, because the opposite curvature (as well as field strength) is less on the gap axis than it is nearer the electrodes, and because the entering ion beam has been more focused toward this central gap axis. Overall, this focusing and defocusing effect of lens 36 in the acceleration mode of operation is negligible in dispersive plane (as well as the non-dispersive plane) due to the "stiffness" of the ion beam and the reduced tendency of beam blow-up.

Variable mass resolution, however, is achieved in the acceleration mode by adjusting the gap d39 between the resolving electrode pair 39. By providing the capability of simultaneous adjustment of the suppression electrode gap d38 along with the resolving electrode gap d39, a negative suppression voltage is maintained on axis with a reasonably small suppression electrode voltage (−10 kV to −15 kV) despite the existence of the large positive voltage at the terminal electrode 37, while still permitting variable mass resolution. For example, by simultaneously adjusting distances d38 and d39, a dispersive plane field potential may be obtained at a central axis of the lens of −165 V when only −12 KV is applied to the suppression electrode 38.

Figure 9:
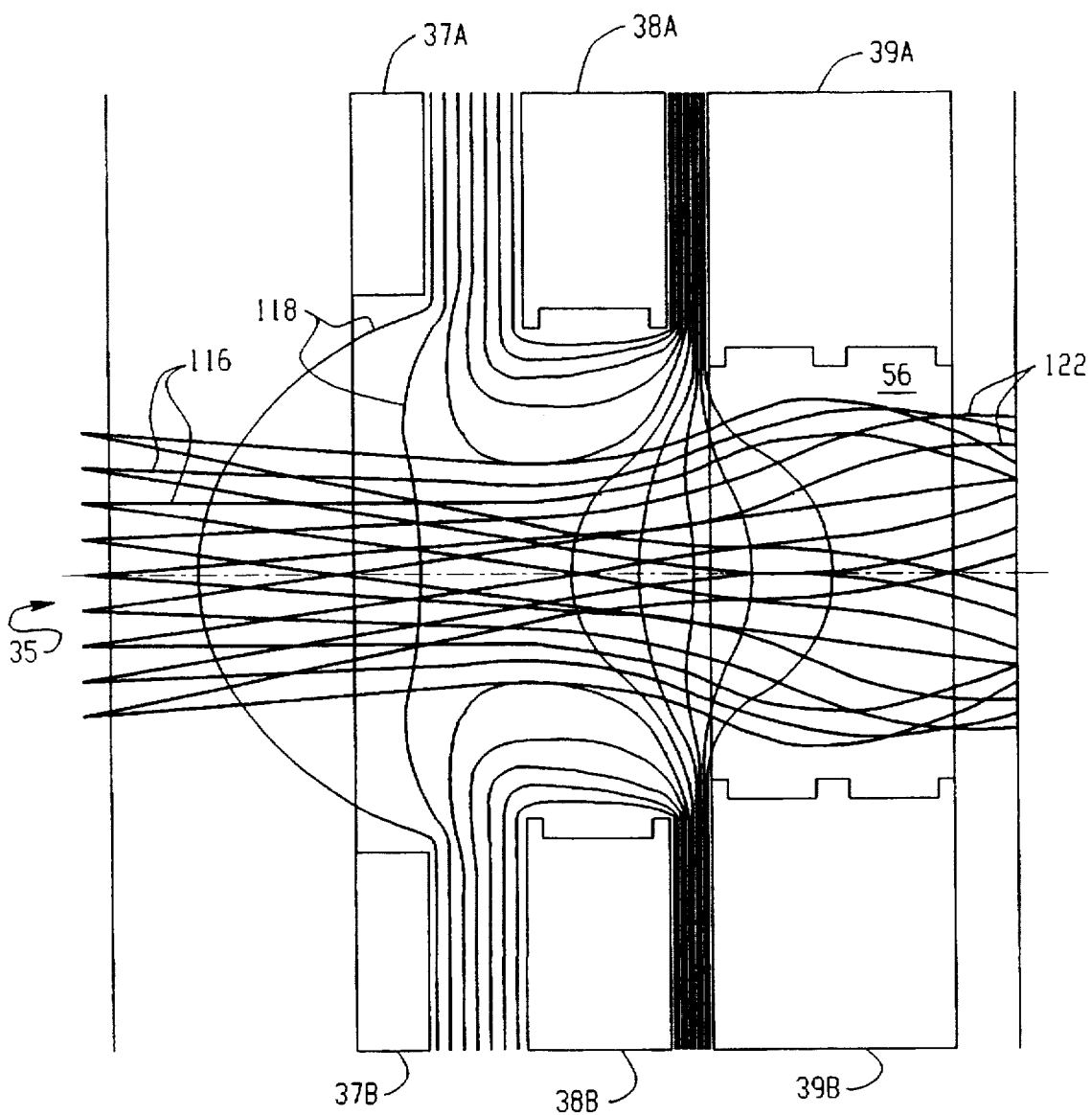
FIG. 9 is the plan view of the electrode components of FIG. 8, further showing the focusing effect of the electrodes in the dispersive plane of an ion beam passing therethrough.

In the deceleration mode of operation, the triode lens 36 functions to focus the ion beam in both the dispersive (FIG. 9) and non-dispersive (FIG. 10) planes. With reference to FIG. 9, an entering ion beam 116 propagating along incoming beam path 35 is initially defocused in the dispersive plane by the curvature of the equi-potential lines 118 near the entrance of the adjustable lens subassembly 40. However, a greater counteractive focusing effect is caused by the opposite curvature of the equi-potential lines near the exit of the lens. This counteractive focusing effect is greater than the initial defocusing effect, because the opposite curvature (as well as field strength) is greater nearer the electrodes than it is on axis, and because the entering ion beam has been defocused toward these electrodes. At this point, the ion beam has decelerated down to approximately 0.5 kV and thus is both highly sensitive to equi-potential line curvature and highly susceptible to beam blow-up. Increased focusing in the dispersive plane is achieved by decreasing the gap d39 of the resolving electrode 39, which increases the field strength and the curvature of the equi-potential lines, and thus, the strength of the dispersive plane focusing.

Figure 10:
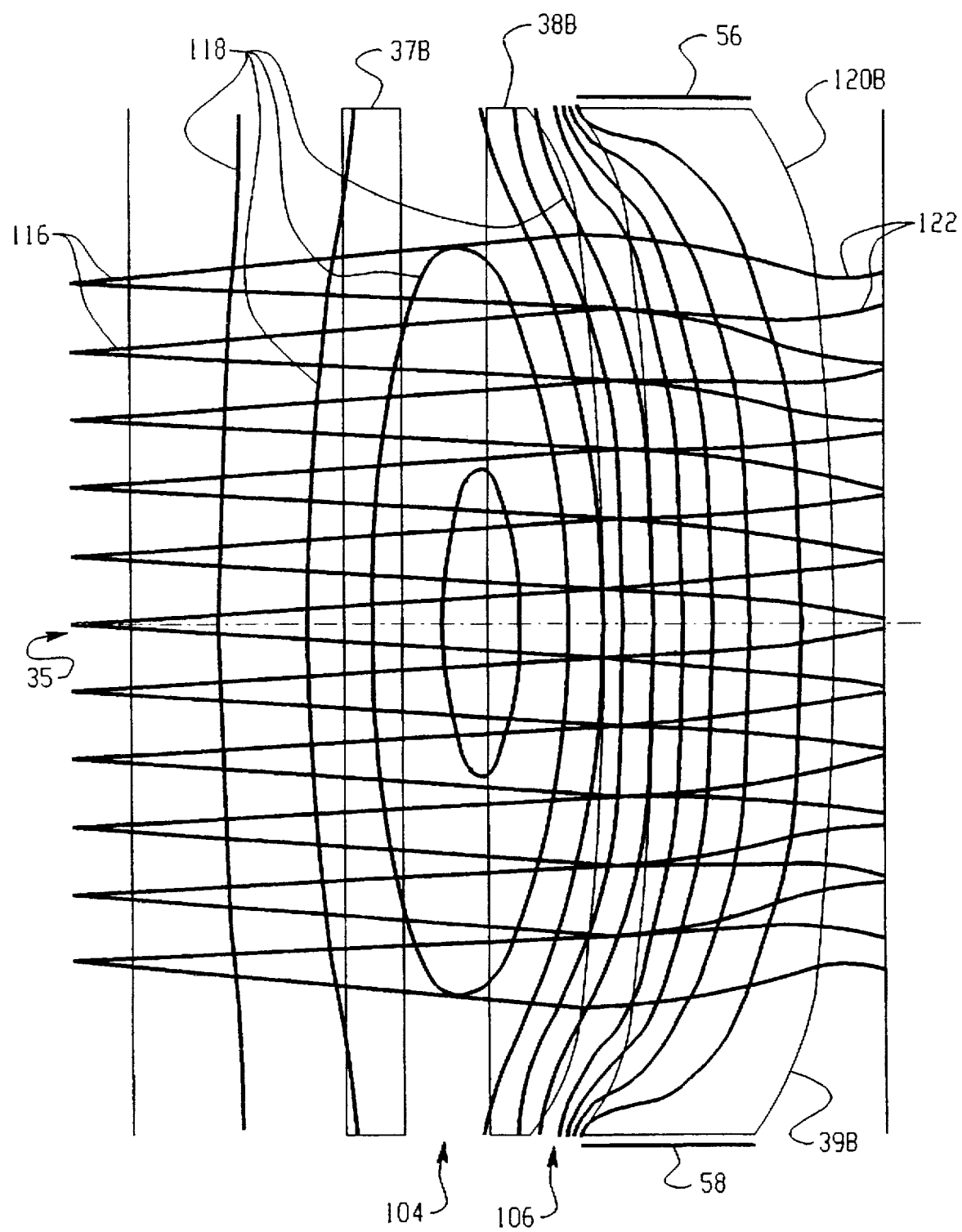
FIG. 10 is the sectional view of the electrode components of FIG. 7, further showing the focusing effect of the electrodes in the non-dispersive plane of an ion beam passing therethrough.

With reference to FIG. 10, focusing in the deceleration mode in the non-dispersive plane is achieved by the curved surfaces 108 and 110 of the suppression and resolving electrodes 38 and 39, respectively (FIG. 7). The voltage applied to the suppression electrode 38 results in correspondingly curved equi-potential lines 118 (FIG. 10). Non-dispersive focusing is not sensitive to the width W5 of the resolving electrode 39, or its final exit configuration, because it is at ground potential (zero field). The resolving electrode 39, however, is provided with a second curved surface 120, which prevents unnecessary clipping of the focused ion beam 122 output by the lens 36.

The end plates 56 and 58 serve to increase the curvature of the equi-potential lines 118 in the non-dispersive plane within the electrode gap, thereby effectively removing focusing aberrations by causing consistent non-dispersive plane focusing independent of position within the dispersive plane. Focusing in the non-dispersive plane is adjusted by altering the voltage applied to the suppression electrode 38, typically within the range of −10 to −25 kilovolts (kV). Generally, more non-dispersive plane focusing is achieved by increasing the magnitude of the negative voltage, which increases the curvature of the equi-potential lines 118 near the exit of the lens.

Control of both the dispersive plane and non-dispersive plane focusing can be achieved rather easily in the deceleration mode of operation using the disclosed invention. First, the non-dispersive plane focusing is adjusted by altering the suppression electrode voltage. Then, adjustment of dispersive plane focusing is accomplished by adjusting the resolving electrode gap d39 (i.e., by simultaneously altering the distances d38 and d39). Moving the suppression electrode 38 together with the resolving electrode 39 does not hinder the focusing effect in the deceleration mode of operation. Initially, adjustable distance d38 is set at approximately 50 mm, and adjustable distance d39 is set at 10 mm less, or approximately 40 mm.

Thus, although the inventive triode lens 36 is particularly useful in high current (15–20 milliamp), low energy (down to 0.5 KeV) applications (deceleration mode), it remains useful in higher energy applications (acceleration mode). In both types of applications, the width of the ion beam is approximately 4 centimeters (cm) in the dispersive plane and 10 cm in the non-dispersive plane. The focus of the ion beam is 10 cm downstream for dispersive plane focusing, and 5 meters (m) upstream for non-dispersive plane focusing.

Accordingly, a preferred embodiment of an adjustable electrostatic lens for variably focusing and variably mass resolving an ion beam has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What we claim is:

1. An ion implantation system (10) comprising:

a terminal (17) for emitting an ion beam;

a beamline section (15) for guiding the ion beam emitted by the terminal; and a target station (16) for receiving the ion beam guided by said beamline section, said beamline section (15) including an electrostatic lens (36) for adjustably mass resolving the ion beam in a first plane and for adjustably focusing the ion beam in the first plane and an orthogonal second plane, said lens (36) comprising:

(i) a terminal electrode (37) having first and second portions (37A, 37B) with a gap (d37) therebetween through which the ion beam passes;

(ii) a resolving electrode (39) having first and second portions (39A, 39B) defining a gap (d39) therebetween through which the ion beam passes; and (iii) a suppression electrode (38), to which a variable voltage may be applied, disposed between said terminal and resolving electrodes and having first and second portions (38A, 38B) defining a gap (d38) therebetween through which the ion beam passes; and (iv) a movement mechanism (60, 62) for imparting simultaneous movement of said first portions of said suppression and resolving electrodes (38A, 39A) toward and away from said second portions of said suppression and resolving electrodes (38B, 39B), respectively.

2. The ion implantation system (10) of claim 1, wherein first portions (38A, 39A) of said suppression electrode (38) and said resolving electrode (39) have corresponding curved surfaces (108A, 110A), respectively, which face each other, and wherein said second portions (38B, 39B) of said suppression electrode (38) and said resolving electrode (39)

have corresponding curved surfaces (108B, 110B), respectively, which face each other.

3. The ion implantation system (10) of claim 1, wherein said first and second portions (38A, 38B) of said suppression electrode (38) have grooved surfaces (112A, 112B) which face each other and by which the ion beam passes.

4. The ion implantation system of claim 1, wherein said gaps d38 and d39 are infinitely adjustable within a given range.

5. The ion implantation system (10) of claim 1, wherein said first and second portions (39A, 39B) of said resolving electrode (39) have grooved surfaces (114A, 114B) which face each other and by which the ion beam passes.

6. The ion implantation system (10) of claim 5, further comprising a first end plate (56) disposed between first ends of said first and second portions (39A, 39B) of said resolving electrode (39), and a second end plate (58) disposed between second ends of said first and second portions (39A, 39B) of said resolving electrode (58), such that said first and second end plates (56, 58) and said grooved surfaces (114A, 114B) form a channel through which the ion beam passes.

7. The ion implantation system (10) of claim 5, wherein said resolving electrode (39) is maintained at electrical ground potential, and said terminal electrode (37) is maintained at either a positive voltage during an acceleration mode of operation of the system (10) or a negative voltage during a deceleration mode of operation of the system.

8. The ion implantation system (10) of claim 5, wherein said first and second portions (39A, 39B) of said resolving electrode (39) are provided with second curved surfaces (120A, 120B) which extend generally parallel to said first curved surfaces (110A, 110B).

9. An electrostatic triode lens (36) for adjustably mass resolving an ion beam in a first plane and for adjustably focusing the ion beam in the first plane and an orthogonal second plane, said lens (36) comprising:
   (i) a terminal electrode (37) having first and second portions (37A, 37B) with a gap (d37) therebetween through which the ion beam passes;
   (ii) a resolving electrode (39) having first and second portions (39A, 39B) defining a gap (d39) therebetween through which the ion beam passes; and
   (iii) a suppression electrode (38), to which a variable voltage may be applied, disposed between said terminal and resolving electrodes and having first and second portions (38A, 38B) defining a gap (d38) therebetween through which the ion beam passes; and
   (iv) a movement mechanism (60, 62) for imparting simultaneous movement of said first portions of said suppression and resolving electrodes (38A, 39A) toward and away from said second portions of said suppression and resolving electrodes (38B, 39B), respectively.

10. The triode lens (36) of claim 9, wherein first portions (38A, 39A) of said suppression electrode (38) and said resolving electrode (39) have corresponding curved surfaces (108A, 110A), respectively, which face each other, and wherein said second portions (38B, 39B) of said suppression electrode (38) and said resolving electrode (39) have corresponding curved surfaces (108B, 110B), respectively, which face each other.

11. The triode lens (36) of claim 9, wherein said first and second portions (38A, 38B) of said suppression electrode (38) have grooved surfaces (112A, 112B) which face each other and by which the ion beam passes.

12. The triode lens (36) of claim 9, wherein said gaps d38 and d39 are infinitely adjustable within a given range.

13. The triode lens (36) of claim 9, wherein said first and second portions (39A, 39B) of said resolving electrode (39) have grooved surfaces (114A, 114B) which face each other and by which the ion beam passes.

14. The triode lens (36) of claim 13, further comprising a first end plate (56) disposed between first ends of said first and second portions (39A, 39B) of said resolving electrode (39), and a second end plate (58) disposed between second ends of said first and second portions (39A, 39B) of said resolving electrode (58), such that said first and second end plates (56, 58) and said grooved surfaces (114A, 114B) form a channel through which the ion beam passes.

15. The triode lens (36) of claim 13, wherein said resolving electrode (39) is maintained at electrical ground potential, and said terminal electrode (37) is maintained at either a positive voltage during an acceleration mode of operation of the system (10) or a negative voltage during a deceleration mode of operation of the system.

16. The triode lens (36) of claim 13, wherein said first and second portions (39A, 39B) of said resolving electrode (39) are provided with second curved surfaces (120A, 120B) which extend generally parallel to said first curved surfaces (110A, 110B).

17. An adjustable lens subassembly (40), for use in a beamline assembly intermediate a terminal and an end station in an ion implantation system, and for adjustably mass resolving an ion beam in a first plane and adjustably focusing the ion beam in the first plane and an orthogonal second plane, said lens subassembly (40) located proximate said terminal and comprising:
   (i) a suppression electrode (38), to which a variable voltage may be applied, having first and second portions (38A, 38B) defining a gap (d38) therebetween through which the ion beam passes;
   (ii) a resolving electrode (39) having first and second portions (39A, 39B) defining a gap (d39) therebetween through which the ion beam passes; and
   (iii) a movement mechanism (60, 62) for imparting simultaneous movement of said first portions of said suppression and resolving electrodes (38A, 39A) toward and away from said second portions of said suppression and resolving electrodes (38B, 39B), respectively.

18. The lens subassembly (40) of claim 17, wherein first portions (38A, 39A) of said suppression electrode (38) and said resolving electrode (39) have corresponding curved surfaces (108A, 110A), respectively, which face each other, and wherein said second portions (38B, 39B) of said suppression electrode (38) and said resolving electrode (39) have corresponding curved surfaces (108B, 110B), respectively, which face each other.

19. The lens subassembly (40) of claim 17, wherein said first and second portions (38A, 38B) of said suppression electrode (38) have grooved surfaces (112A, 112B) which face each other and by which the ion beam passes.

20. The lens subassembly (40) of claim 17, wherein said gaps d38 and d39 are infinitely adjustable within a given range.

21. The lens subassembly (40) of claim 17, wherein said first and second portions (39A, 39B) of said resolving electrode (39) have grooved surfaces (114A, 114B) which face each other and by which the ion beam passes.

22. The lens subassembly (40) of claim 21, further comprising a first end plate (56) disposed between first ends of said first and second portions (39A, 39B) of said resolving electrode (39), and a second end plate (58) disposed between second ends of said first and second portions (39A, 39B) of said resolving electrode (58), such that said first and second end plates (56, 58) and said grooved surfaces (114A, 114B) form a channel through which the ion beam passes.

23. The lens subassembly (40) of claim 21, wherein said resolving electrode (39) is maintained at electrical ground potential.

24. The lens subassembly (40) of claim 21, wherein said first and second portions (39A, 39B) of said resolving electrode (39) are provided with second curved surfaces (120A, 120B) which extend generally parallel to said first curved surfaces (110A, 110B).

25. A method of focusing an ion beam in orthogonal planes, using an adjustable electrostatic lens subassembly comprising a suppression electrode (38) and a resolving electrode (39), comprising the steps of:
- (i) providing a first gap between first and second portions (38A, 38B) of said suppression electrode (38), said first gap having a first distance (d38);
- (ii) providing a second gap between first and second portions (39A, 39B) of said resolving electrode (39), said second gap having a second distance (d39);
- (iii) directing an ion beam through said first and second gaps;
- (iv) altering the amount of voltage applied to said suppression electrode (38) to focus the ion beam in a first plane; and
- (v) simultaneously altering said first and second distances (d38, d39) to focus the ion beam in a second plane, said second plane being disposed substantially perpendicular to said first plane.

26. The method of claim 25, wherein said first distance (d38) is greater than said second distance (d39).

27. The method of claim 25, further comprising the step of curving surfaces (108A, 108B) on said first and second portions (38A, 38B) of said suppression electrode (38), and surfaces (110A, 110B) on said first and second portions (39A, 39B) of said resolving electrode (30), said curved surfaces (108, 110) facing each other.

28. The ion implantation system of claim 25, wherein said ion beam decelerates as it is directed through said gaps.

29. The method of claim 25, further comprising the steps of providing grooved surfaces (112A, 112B) which face each other on said first and second portions (38A, 38B) of said suppression electrode (38), and grooved surfaces (114A, 114B) which face each other on said first and second portions (39A, 39B) of said resolving electrode (39).

30. The method of claim 29, further comprising the step of providing a first end plate (56) disposed between first ends of said first and second portions (39A, 39B) of said resolving electrode (39), and a second end plate (58) disposed between second ends of said first and second portions (39A, 39B) of said resolving electrode (39), such that the ion beam is directed through a channel formed by said first and second end plates (56, 58) and said grooved surfaces (114A, 114B).

* * * * *